United States Patent [19]
Gardner

[11] Patent Number: 6,027,980
[45] Date of Patent: *Feb. 22, 2000

[54] METHOD OF FORMING A DECOUPLING CAPACITOR

[75] Inventor: Donald S. Gardner, Mountain View, Calif.

[73] Assignee: Intel Corporation, Santa Clara, Calif.

[*] Notice: This patent is subject to a terminal disclaimer.

[21] Appl. No.: 08/848,506

[22] Filed: Apr. 28, 1997

Related U.S. Application Data

[60] Division of application No. 08/571,446, Dec. 13, 1995, which is a continuation-in-part of application No. 08/515,249, Aug. 15, 1995, Pat. No. 5,583,739, which is a division of application No. 08/093,046, Jul. 15, 1993, Pat. No. 5,472,900, which is a continuation-in-part of application No. 07/815,234, Dec. 31, 1991, Pat. No. 5,285,017.

[51] Int. Cl.[7] .................................................. H01L 21/20
[52] U.S. Cl. .......................................... 438/396; 438/253
[58] Field of Search .................................. 438/239, 250, 438/253, 257, 396, 399, 622, 634, 652, 657

[56] References Cited

U.S. PATENT DOCUMENTS

| | | | |
|---|---|---|---|
| 4,023,197 | 5/1977 | Magdo et al. | 357/71 |
| 4,628,406 | 12/1986 | Smith et al. | 361/386 |
| 4,803,450 | 2/1989 | Burgess et al. | 333/238 |
| 4,855,953 | 8/1989 | Tsukamoto et al. | 365/149 |
| 4,931,411 | 6/1990 | Tigelaar et al. | 437/192 |
| 5,006,481 | 4/1991 | Chan et al. | 437/52 |
| 5,056,216 | 10/1991 | Madou et al. | 29/843 |
| 5,079,670 | 1/1992 | Tigelaar et al. | 361/313 |
| 5,104,822 | 4/1992 | Butler | 437/52 |
| 5,119,154 | 6/1992 | Gnadinger | 357/23.6 |
| 5,126,794 | 6/1992 | Altmann | 355/221 |
| 5,139,971 | 8/1992 | Giridhar et al. | 437/195 |
| 5,165,166 | 11/1992 | Carey | 29/847 |
| 5,210,379 | 5/1993 | Okonogi et al. | 174/264 |
| 5,262,596 | 11/1993 | Kawakami et al. | 174/261 |
| 5,308,929 | 5/1994 | Tani et al. | 174/262 |
| 5,414,221 | 5/1995 | Gardner | 174/261 |
| 5,472,900 | 12/1995 | Vu et al. | 438/396 |
| 5,583,739 | 12/1996 | Vu et al. | 361/313 |
| 5,691,229 | 11/1997 | Okamura et al. | 148/DIG. 14 |

OTHER PUBLICATIONS

Roskos, H., et al.; "Propagation of Picosecond Electrical Pulses on a Silicon–Based Microstrip Line with Buried Cobalt Silicide Ground Plane"; *Appl. Phys. Lett.* 58 (23), Jun. 10, 1991; pp. 2604–2606.

*Primary Examiner*—Charles Bowers
*Assistant Examiner*—Jack Chen
*Attorney, Agent, or Firm*—David J. Kaplan

[57] ABSTRACT

A decoupling capacitor incorporated into an integrated circuit. The capacitor is disposed over a first region of a substrate comprising electronic circuitry, and not over a second region of the substrate. The capacitor comprises a lower and an upper conductive layer separated by an interposing insulative layer. An additional insulative layer is disposed beneath the lower conductive layer while another insulative layer is disposed above the upper conductive layer, and the capacitor provides capacitance for the electronic circuitry.

12 Claims, 13 Drawing Sheets

METHOD OF FORMING A DECOUPLING CAPACITOR

This is a continuation of application Ser. No. 08/571,446, filed Dec. 13, 1995, which is a continuation-in-part of application Ser. No. 08/515,249, filed Aug. 15, 1995 issued U.S. Pat. No. 5,583,739, which is a divisional of application Ser. No. 08/093,046, filed Jul. 15, 1993 issued U.S. Pat. No. 5,472,900, which is a continuation-in-part of application Ser. No. 07/815,234, filed Dec. 31, 1991 issued U.S. Pat. No. 5,285,017.

BACKGROUND OF THE INVENTION

1. Field of the Invention

The present invention relates to electronic circuits, and more particularly relates to an on-chip decoupling capacitor.

2. Background Information

Electronic circuits, and particularly computer and instrumentation circuits, have in recent years become increasingly powerful and fast. As circuit frequencies exceed several hundred megahertz (MHz), with the associated spectral components exceeding 10 gigahertz (GHz), noise in the DC power and ground lines increasingly becomes a problem. This noise can arise due to, for example, inductive and capacitive parasitics, as is well known. To reduce this noise, capacitors known as decoupling capacitors are often used to provide a stable supply of power to the circuitry. The decoupling capacitors are placed as close to the load as practical to increase their effectiveness. Typically the decoupling capacitors are placed in the same package as the chip, but unfortunately, this arrangement is costly to manufacture. Typically, one or more capacitors having a low capacitance value are needed to reduce the effect of high frequency, low amplitude noise, while one or more capacitors having a high capacitance value are needed to reduce low frequency, high amplitude noise.

As mentioned above, the closer the capacitor is to the load, the more effective it is in eliminating or reducing the noise in the power and ground lines. Because the integrated circuit on a chip may constitute the load, the most effective solution would be to fabricate a capacitor directly on the chip itself. However, such a capacitor would be costly to manufacture using prior art methodologies. In particular, a typical processing sequence would require a deposition, patterning, and etch of a first dielectric layer, to isolate underlying metal layers from the capacitor. Following the first dielectric layer, the lower plate of the capacitor could be formed by depositing, patterning and etching a first metal layer. Then, the interplate dielectric could be formed by depositing, patterning and etching a second dielectric layer. Next, a second metal layer forming the second plate of the capacitor could be deposited, patterned and etched followed by a final dielectric layer deposition, patterning and etch to isolate the capacitor. The various patterning and etch steps are needed in order to connect one plate of the capacitor to power and the other to ground, as well as to provide vias for interconnection from one or more metal layers below the capacitor to one or more metal layers above the capacitor. Unfortunately, the above described processing requires at least four patterning steps, which is very costly.

What is needed is a manufacturable method and structure for producing a decoupling capacitor directly on the substrate containing the circuitry to which the power is supplied.

SUMMARY OF THE INVENTION

A decoupling capacitor incorporated into an integrated circuit is disclosed. The capacitor is disposed over a first region of a substrate comprising electronic circuitry, and not over a second region of the substrate. The capacitor comprises a lower and an upper conductive layer separated by an interposing insulative layer. An additional insulative layer is disposed beneath the lower conductive layer while another insulative layer is disposed above the upper conductive layer, and the capacitor provides capacitance for the electronic circuitry.

Additional features and benefits of the present invention will become apparent from the detailed description, figures, and claims set forth below.

DETAILED DESCRIPTION

Decoupling capacitors and methods for fabricating such capacitors are disclosed. In the following description, numerous specific details are set forth, such as materials, thicknesses, processing sequences, etc., in order to provide a thorough understanding of the present invention. However, one skilled in the art would understand that the present invention may be practiced without these specific details. In other instances, well known processing steps and device structures have not been described in detail in order to avoid unnecessarily obscuring the present invention. Furthermore, although the present invention is described below as being fabricated, for example, in a VLSI or ULSI integrated circuit chip, one skilled in the art would understand that the present invention could be embodied within, for example, multi-chip modules (MCM), circuit boards, or other structures that require a capacitor in close proximity to circuitry.

The capacitor of the present invention is typically formed on a substrate having underlying circuitry or device layers. The first plate of the capacitor is deposited on a dielectric layer and comprises a conductive material such as a metal. Next, a thin insulative layer having a high dielectric constant is deposited, followed by a second conductive layer forming the upper plate of the capacitor. Finally, another insulative layer is deposited on the upper capacitor plate.

In one embodiment of the present invention, a single masking layer is used to pattern vias extending through all insulative and conductive layers. A blanket dielectric layer is then deposited and anisotropically etched to form a sidewall insulator for the vias. Next, a metal layer is deposited to provide interconnection between metal layers beneath the capacitor and upper level metal layers. In this way, no additional masking steps are required to form the capacitor. In some embodiments, one to two masking steps are added to the process to provide for connection of the plates of the capacitor to power and ground. In another embodiment of the present invention, a preexisting level of interconnections consisting solely of power lines or a power plane is used as one plate of the capacitor. In a further embodiment of the present invention, the capacitor is formed on some areas of the substrate and not others. In the regions where a capacitor is not needed or desired, the layer forming one of he plates of the capacitor may be used as an embedded ground plane.

Figure 1A:
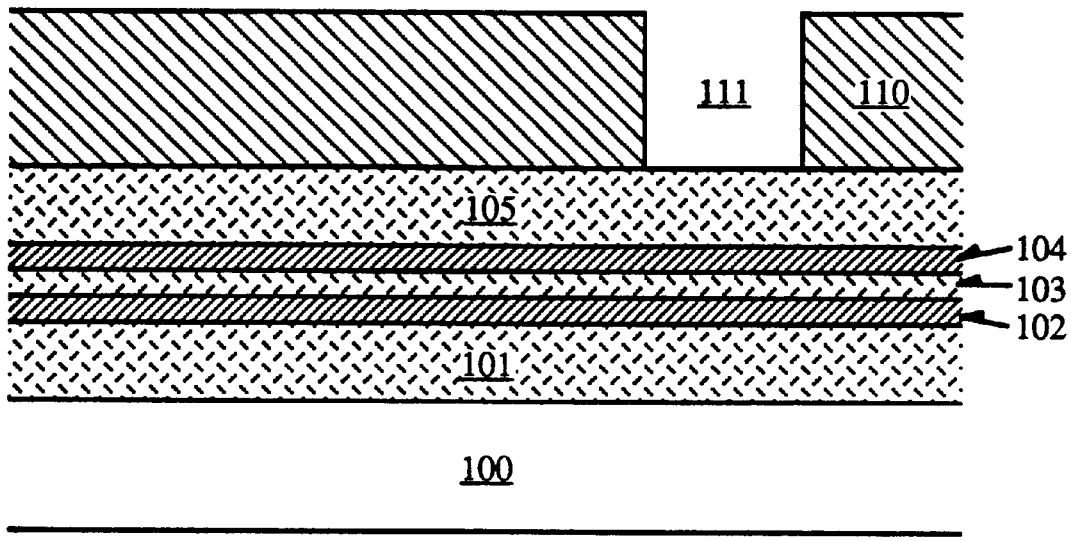
FIGS. 1A–1E illustrate the fabrication of an on-substrate capacitor according to a preferred embodiment of the present invention.

Referring now to FIG. 1A, a cross-sectional elevated view of a preferred embodiment of the present invention is shown. Substrate 100 is a semiconductor wafer having device regions such as diffused junctions, gates, local interconnects, metal layers, or other device structures or layers. In many cases, depending upon the device being fabricated, device layers, structures, or processing steps, which are present for reasons other than to fabricate the capacitor of the present invention, may be used in the fabrication of the capacitor of the present invention. Generally, these structures or steps will be referred to as "preexisting" structures or steps. Use of this terminology is not meant to imply that the structure or step is known in the prior art; rather, this terminology is used to denote a structure or step which may otherwise be required in the fabrication of the device outside of its use in fabricating the capacitor.

In the present invention, dielectric layer 101 is deposited over substrate 100. Dielectric layer 101 has a thickness in the range of approximately 0.1–1.0 $\mu$m. Layer 101 is doped or undoped silicon dioxide ($SiO_2$), silicon nitride ($Si_3N_4$), silicon oxynitride ($SiO_xN_y$), or other substantially dielectric material. For one embodiment, insulative layer 101 is a preexisting layer. The thickness and material of layer 101 is not critical, so long as layer 101 provides electrical isolation between any previous conductive layer in substrate 100 and conductive layer 102, which is next deposited on insulative layer 101. Conductive layer 102 forms the lower plate of the capacitor and will alternatively be referred to as plate 102 herein. In a currently preferred embodiment, conductive layer 102 comprises a metal such as aluminum, tungsten, copper or one or more other similar materials. The choice of materials may depend on other processing considerations. For example, if the substrate will be subjected to temperatures of approximately 660° C. or above, aluminum cannot be used since this is above its melting point. In a currently preferred embodiment, layer 102 is deposited to a thickness in the range of approximately 0.05–1.0 $\mu$m. As discussed above, a preexisting layer, such as a metallization layer, may be used to form plate 102 so that the thickness and material of plate 102 may be dictated by other processing or device considerations.

Following deposition of conductive layer 102, insulative layer 103 is deposited on conductive layer 102. Insulative layer 103 comprises undoped $SiO_2$ and is in the range of approximately 0.01–1.0 $\mu$m thick. As is well known, the capacitance between the plates of a capacitor is proportional to the dielectric constant of the dielectric between the plates, and inversely proportional to the separation between the plates. Therefore, to increase the capacitance, layer 103 is made as thin as is practical and preferably comprises a material having a high dielectric constant. Also as is well known, the capacitance is proportional to the area of the plates of the capacitor. Therefore, a desired capacitance of the decoupling capacitor can be achieved by adjusting any or all of the area of the plates, separation of the plates, and dielectric constant of the material between the plates, depending upon process and device requirements.

Conductive layer 104, which forms the upper plate of the capacitor of the present invention is next deposited on insulative layer 103. As with conductive layer 102, the thickness and material of layer 104 may vary. In a currently preferred embodiment, layer 104 comprises a metal such as, for example, aluminum, tungsten, or copper, and is deposited to a thickness in the range of approximately 0.05–1.0 $\mu$m. Insulative layer 105 is then deposited on conductive layer 104. Insulative layer 105 can be made from the same materials as insulative layer 101. In a currently preferred embodiment, insulative layer 105 is deposited to a thickness in the range of approximately 0.1–1.0 $\mu$m.

Note that the capacitor plates 102 and 104 of the present invention are completely embedded within dielectric layers 101 and 105. The entire structure (layers 101 through 105) can, in essence, take the place of any preexisting insulative layer, such as an interlevel dielectric (ILD), even if further connection is required from metal layers above to metal layers below the capacitor, as will be shown below. Alternatively, as with conductive layers 102 and 104, a preexisting dielectric layer may be used to form, for example, any of the insulative layers 101, 103 and 105. Typically, the capacitor of the present invention will be formed near the end of the microchip fabrication process, and the exact location of the capacitor will depend upon the particular device being fabricated.

The fabrication of an isolated via through the capacitor of the present invention is illustrated in FIGS. 1A through 1E. First photoresist layer 110, having opening 111 therein, is formed by well known methods on insulative layer 105. Next, a sequential etch is performed first through layer 105, then through layer 104, 103, 102, and finally layer 101. The etching of layers 101 through 105 is carried out using the single masking layer 110. While each layer may require a different etching process, the etching of all of layers 101 through 105 often can be performed in a single etch system with differing etch parameters and chemistries which are optimized to etch the material exposed. In some instances, a single etchant may be able to etch all layers. For example, if layers 102 and 104 are tungsten and layers 101, 103, and 105 comprise $SiO_2$, an etch with a fluorine based chemistry can etch all layers.

Figure 1B:
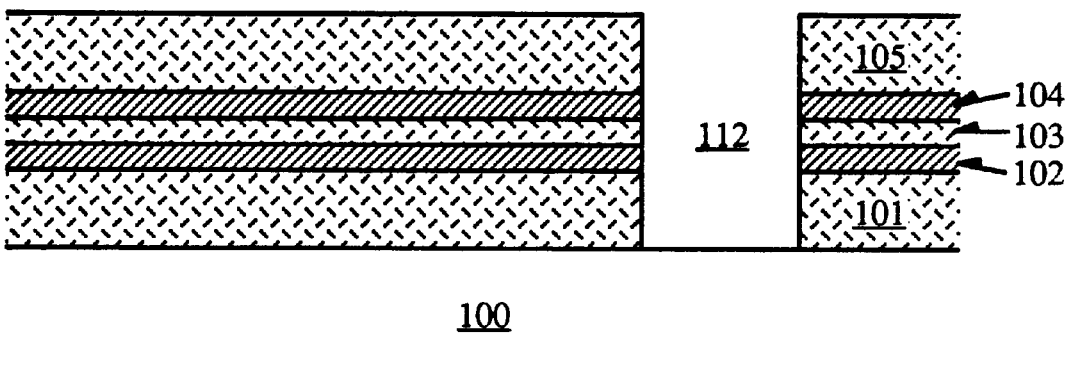

After the etch step is completed, the structure is as shown in FIG. 1B, with via 112 formed through layers 101–105. In the art, openings which expose silicon contact regions, such as sources and drains in MOS devices, are generally referred to as "contact openings," while openings which expose other structures, such as underlying metal layers, are generally referred to as "vias." In describing the structures herein, the terms "via" and "contact opening" are used to indicate that the opening may be of the type referred to. However, it will be understood that the described opening could be a via or a contact opening depending upon the underlying layer which is exposed, and use of a particular term in the detailed description is not meant to limit the structure to the more restrictive definition of the particular term used.

Figure 1C:
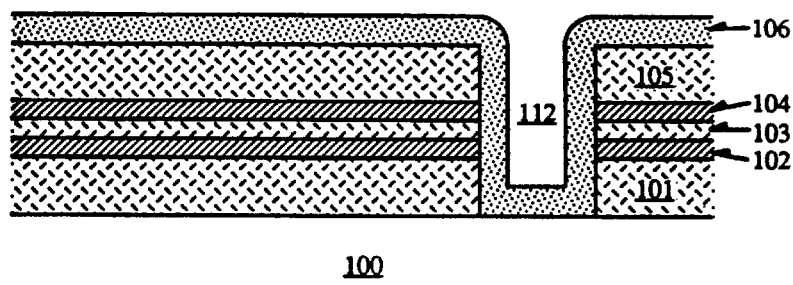

Next, as shown in FIG. 1C, insulative layer 106 is deposited on insulative layer 105 and on the sides and bottom of via 112. Following deposition of insulative layer 106, an anisotropic etch is carried out which etches insulative layer 106 from all horizontal surfaces. Insulative layer 106 will therefore be removed from the upper surface of insulative layer 105, and the bottom of via 112, but not from the sidewalls of via 112.

Figure 1D:
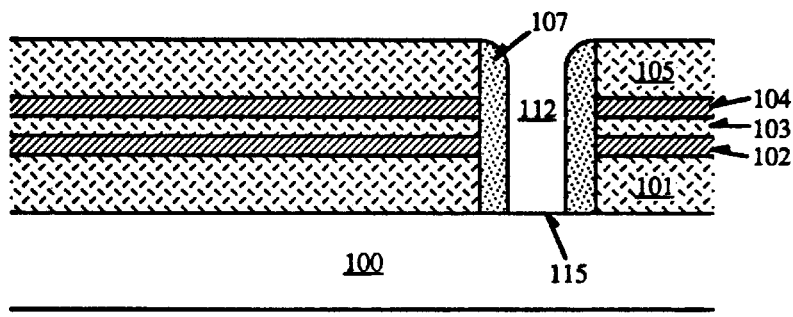

After the anisotropic etch, the structure appears as shown in FIG. 1D, with sidewall insulator 107 formed on the sidewalls of via 112. Via 112 exposes region 115 of substrate 100. Region 115 is a previously formed metal layer. For another embodiment of the present invention, the via exposes a device region that is to be connected to an upper level conductive layer. It will be appreciated that there will be many such vias 112 in each location where it is necessary to couple an upper conductive level with a lower conductive region. If desired, a hard mask layer such as $Si_3N_4$ or Al can be deposited on insulative layer 105 prior to patterning layer 110, which will provide a more robust mask for the etch through layers 101–105.

Following formation of via 112, conductive layer 108 is deposited in via 112 and on the surface of insulative layer 105. Conductive layer 108 is then patterned using well known methods to form an interconnection layer. As an alternative to using conductive layer 108 to fill via 112, via 112 is filled with a conductive material in an etch-back, or more particularly, a polish-back process, to form a plug which electrically couples region 115 to a subsequently deposited conductive layer. The process to fill via 112 could be a selective deposition of, for example, tungsten, or doped polysilicon, or a blanket deposition and etch-back of tungsten and/or other conductive materials. After the via fill in this alternative embodiment, a conductive layer is deposited on the surface of the upper insulative layer and on the via plug, and is patterned as before.

As described above, layers 101–105 may be located within the device in the same position as a preexisting dielectric layer. Therefore, any vias 112 can be formed in the same point in the process as a via etch of another device structure, with no increase in masking steps, with only the addition of the process shown in FIGS. 1C and 1D for forming sidewall insulator 107. Connection of one of the capacitor plates to ground, and the other to a power supply, may, but ideally should not require additional processing as will be described below.

Figure 2:
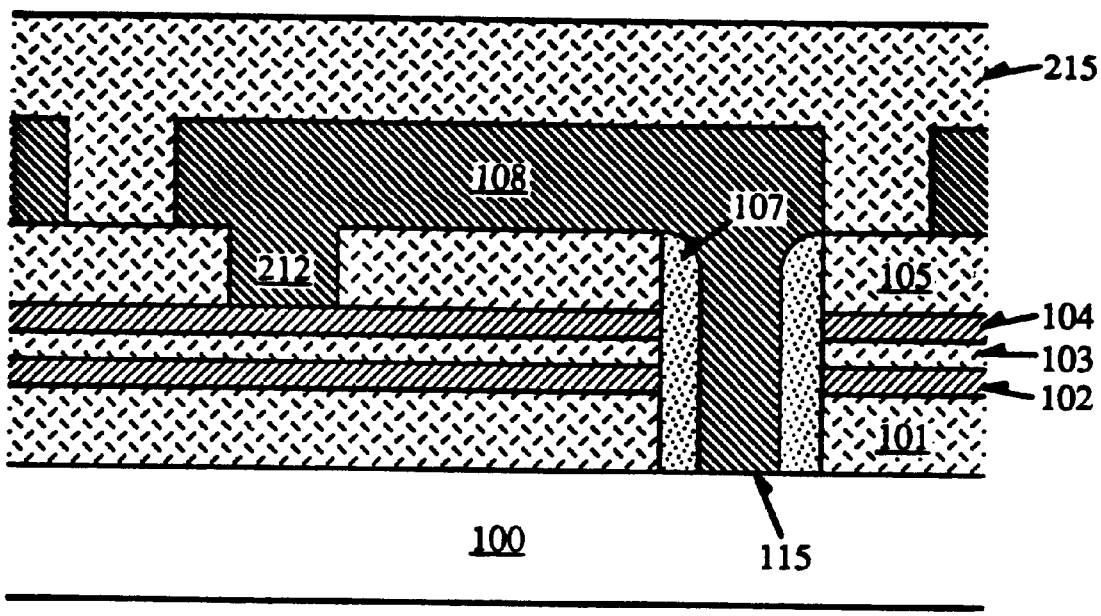
FIG. 2 shows one method of coupling the upper capacitor plate to an underlying conductive level.

Referring to FIG. 2, connection of the upper capacitor plate 104 using interconnection layer 108 is shown. Interconnection layer 108, as described above, contacts substrate 100 in region 115, which in this case is a previously formed metal layer. The previously formed metal layer can be connected to either power or ground. To form the connection to ground or power as shown in FIG. 2, the structure of FIG. 1D is patterned, followed by an etch of layer 105 to form via 212 of FIG. 2. Next, layer 108 is deposited, patterned, and etched to form the connection shown. The masking step to form via 112 may be in addition to normal processing, or may be done as a part of, for example, processing for via formation of subsequent levels of interconnections, depending upon the specific process sequence. The masking, patterning and etch of layer 108 is typically done concurrently with preexisting interconnection processing. Finally, dielectric layer 215 is deposited as shown. Dielectric layer 215 is another interlevel insulator or a final passivation layer.

Figure 3A:
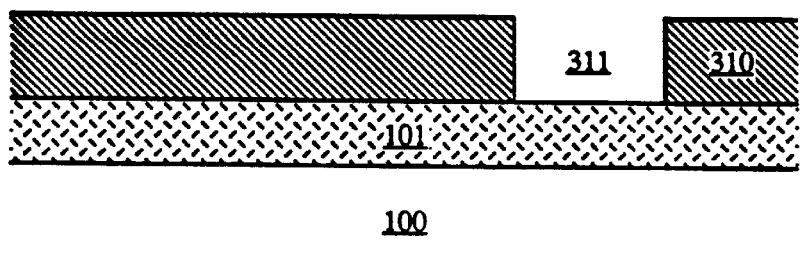
FIGS. 3A–3C show one method for coupling the lower capacitor plate to an underlying conductive layer.
Figure 3B:
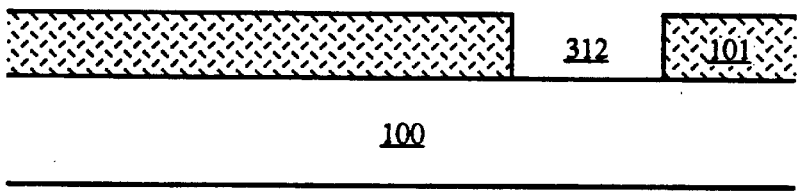
Figure 3C:
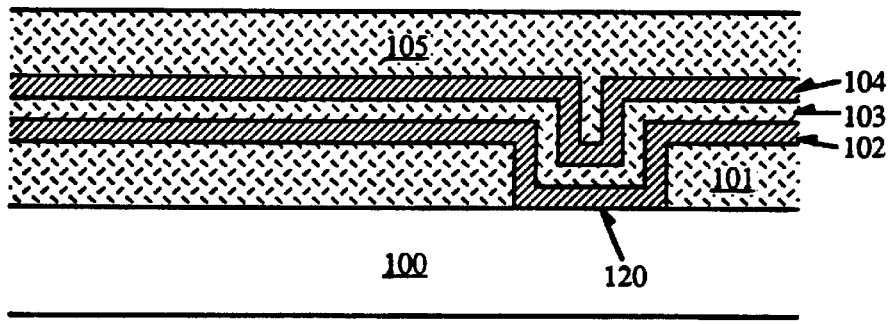

Referring to FIGS. 3A through 3C, a method for coupling the lower plate to power or ground is shown. As shown in FIG. 3A, after deposition of layer 101, patterning layer 310 with opening 311 is formed thereon. Next, layer 101 is etched in the region exposed by opening 311, to form via 312. Following removal of patterning layer 310, the structure appears as shown in FIG. 3B. Next, layers 102, 103, 104 and 105 are deposited as described above. The resulting structure is shown in FIG. 3C. As can be seen, layer 102 is deposited in via 312 and is therefore in contact with substrate 100 in the region 120, which is a previously formed metal layer coupled to either power or ground.

Use of the technique shown in FIGS. 3A through 3C requires the additional masking step shown in FIG. 3A. If a device has both power and ground metallization below the capacitor, then either or both of the methods shown in FIGS. 2 and 3C can be used to connect the capacitor to both power and ground. Alternatively, either or both plates can be coupled to power or ground metallization disposed above the capacitor by formation of vias through the appropriate layers of the capacitor to expose a portion of a plate for subsequent coupling to the overlying metallization. One such method is shown in FIGS. 5A and 5B, described later.

Figure 4A:
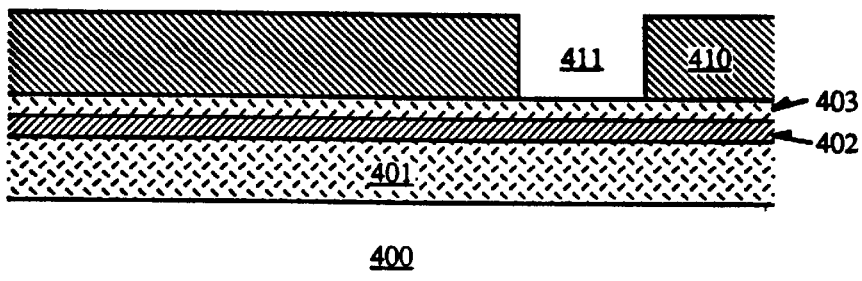
FIGS. 4A–4E illustrate fabrication of an on-substrate capacitor according to the present invention utilizing a conductive level for power distribution as one plate of the capacitor.
Figure 4B:
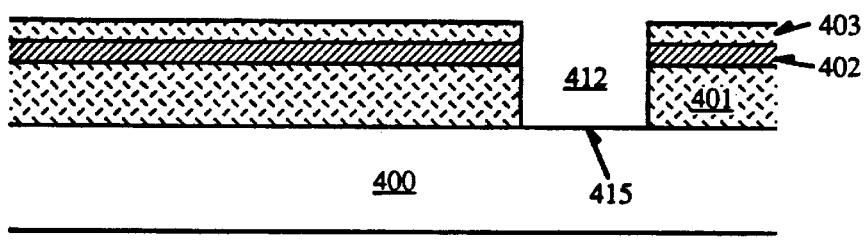

In the present invention, one or more of capacitor plates 102 and 104 can be fabricated from layers used for other purposes. For example, either of these capacitor plates may be made from a metal layer used for interconnections. Alternatively, one of the capacitor plates can be formed from a conductive level used for power distribution, such as a metal level consisting primarily of power or ground lines or a previously existing power or ground plane. FIGS. 4A through 4E show the fabrication of the capacitor of the present invention using a preexisting power distribution level as the upper capacitor plate. FIG. 4A shows substrate 400, having insulative layer 401, lower capacitor plate 402, and insulative layer 403 formed thereon. Substrate 400, and layers 401 through 403 are similar to substrate 100, and layers 101 through 103 of FIG. 1, respectively. As with layer 103, insulative layer 403 is preferably a thin layer, made of material having a high dielectric constant, to increase the capacitance.

Figure 4C:
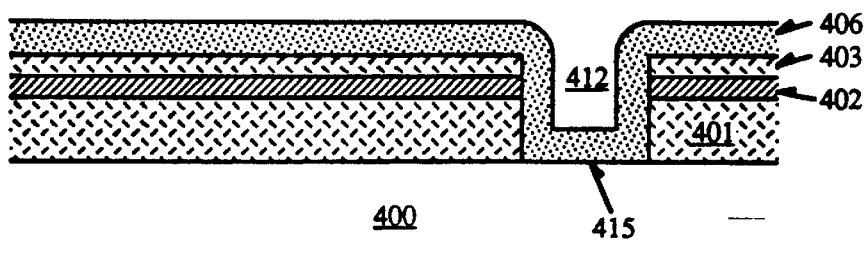
Figure 4D:
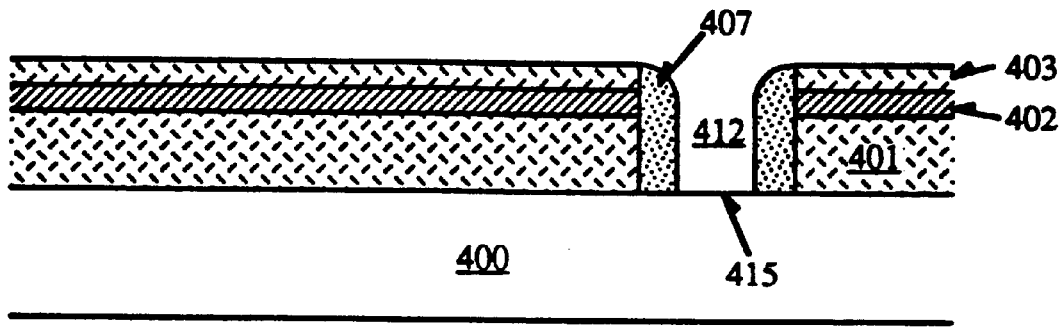

After deposition of insulative layer 403, which serves as a dielectric between the capacitor plates, patterning layer 410, with opening 411 formed therein, is formed as shown. Next, an etch through layers 401 through 403 is performed, similar to the previously described etches, to form via 412 exposing substrate 400 in the region 415 as shown. Region 415 is a previously formed metal layer. Next, as shown in FIG. 4C, insulative layer 406 is deposited on insulative layer 403 and in via 412. Next, an anisotropic etch is then performed, resulting in the structure shown in FIG. 4D, having sidewall insulator 407. Next, power distribution level 404, which serves as the upper plate of the capacitor, is deposited on insulative layer 403 and in via 412. In a currently preferred embodiment, power distribution level 404 is deposited to a thickness in the range of approximately 0.2–2.0 $\mu$m, and comprises a conductive material such as an aluminum alloy, tungsten, or copper. Alternatively, a separate via fill process, as described above in regard to filling via 112, could be used to fill via 412 prior to deposition of power distribution level 404. Next, insulative layer 405 is deposited on power distribution level 404 resulting in the structure illustrated in FIG. 4E.

Figure 4E:
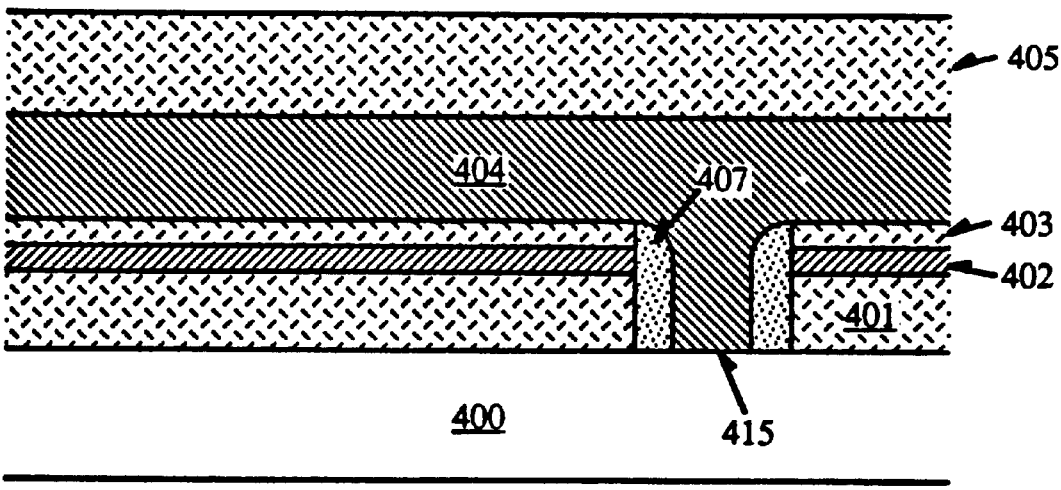
Figure 5A:
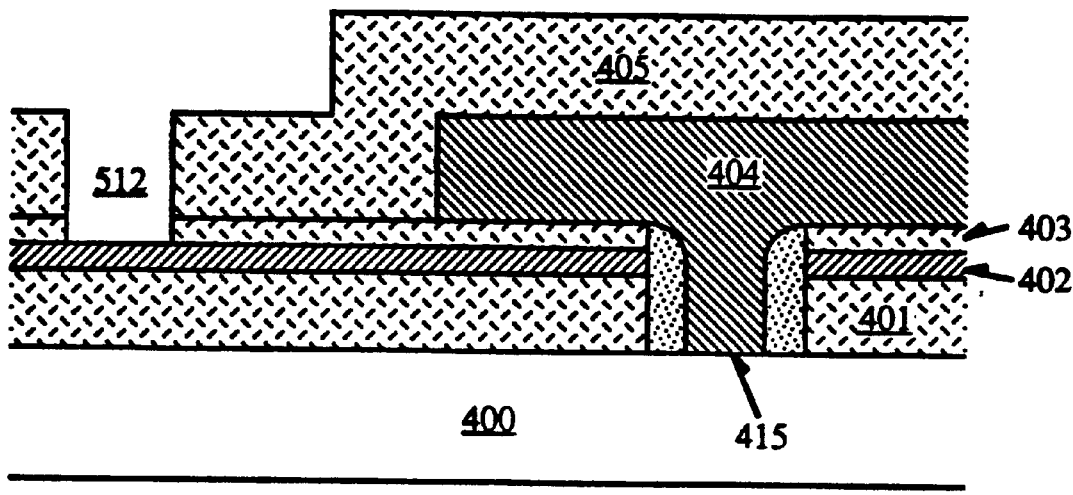
FIGS. 5A and 5B illustrate one method of coupling the lower plate of the capacitor of FIG. 4 to ground.
Figure 5B:
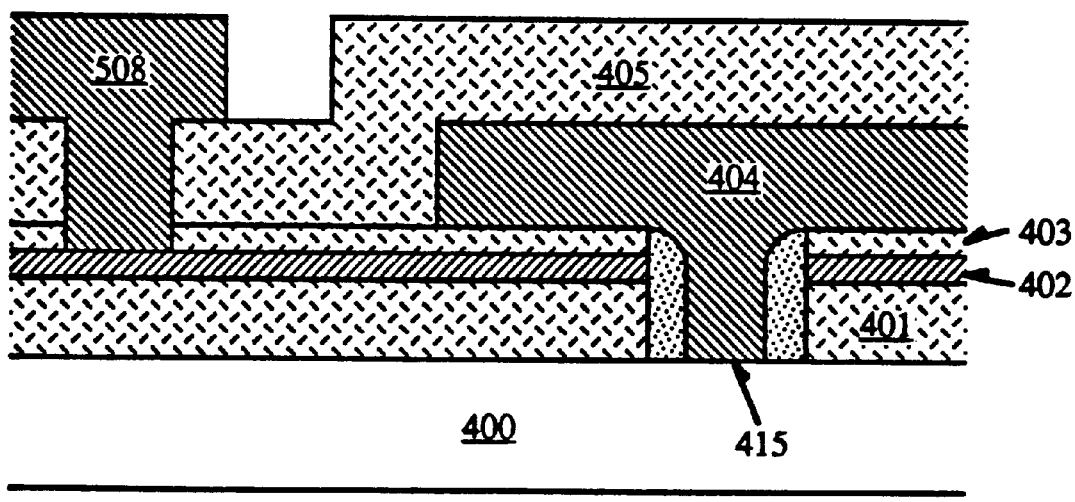

FIGS. 5A and 5B illustrate a method of coupling the lower capacitor plate 402 of the structure shown in FIG. 4E to ground. FIG. 5A shows a region where power distribution level 404 is not present over layer 402. That is, insulative layer 405 is deposited directly on insulative layer 403, as shown on the left hand side of FIG. 5A. After deposition of insulative layer 405, a patterning layer having an opening which exposes the surface of insulative layer 405 in the region which will become via 512, is formed. Next, an etch is performed through layers 405, and 403 to form via 512, exposing capacitor plate 402. A conductive layer is then deposited and patterned to form connection 508 to ground, as shown in FIG. 5B. As with layer 108 of FIG. 1E, connection of plate 402 to ground through layer 508 is typically done concurrently with preexisting interconnection processing. The connection to ground may require an additional processing step, or may be part of normal processing for interconnection layer 508.

Figure 6A:
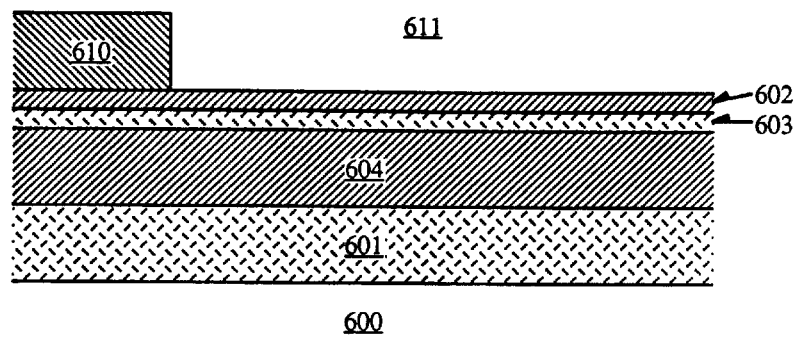
FIGS. 6A–6F illustrate the fabrication of an on-substrate capacitor over portions of a pre-existing power distribution level.

Referring to FIGS. 6A–6F, a method of forming a capacitor in selective areas of the substrate is shown. In FIG. 6A, substrate 600, having dielectric layer 601 and a portion of power distribution level 604 formed thereon, is shown. Deposited on top of power distribution level 604 is dielectric 603 which, in a currently preferred embodiment, comprises a thin layer of silicon nitride having a thickness of approximately 0.05–1.0 μm. Capacitor plate 602 is deposited on top of insulative layer 603 and is generally similar to the capacitor plates 102, 104, and 402 described previously. Patterning layer 610, which exposes region 611, is formed thereon. Next, an etch through capacitor plate 602 is performed, followed by an etch through insulative layer 603 in the region 611. In a currently preferred embodiment, these two etch steps are performed in separate, sequential processing steps. However, with a suitable etchant these etches may be performed in a single step. Note that power distribution level 604 may not be present under insulative layer 603 in all areas of the substrate, so that insulative layer 603 may be disposed on, for example, an $SiO_2$ layer such as dielectric layer 601. Therefore, silicon nitride is preferred for insulative layer 603 as it may be etched selectively from an $SiO_2$ surface.

Figure 6B:
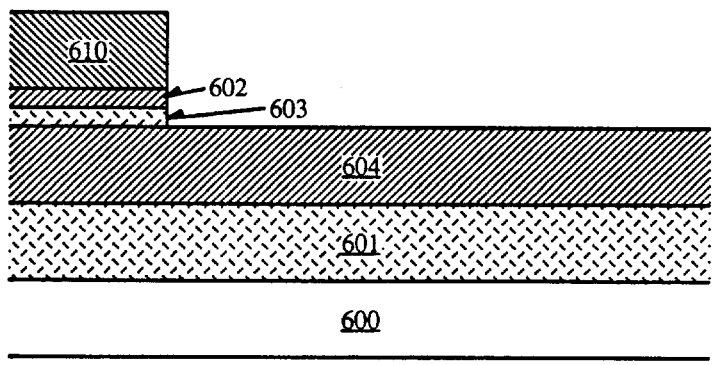
Figure 6C:
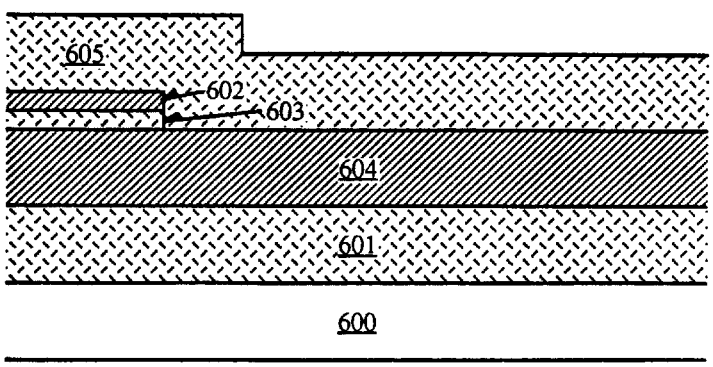
Figure 6D:
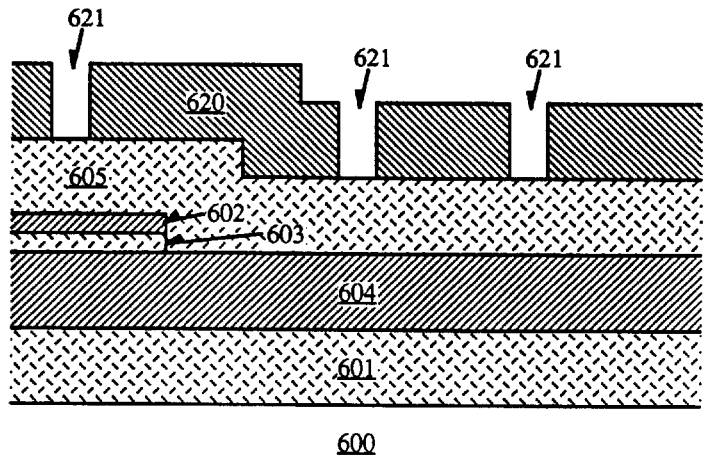
Figure 6E:
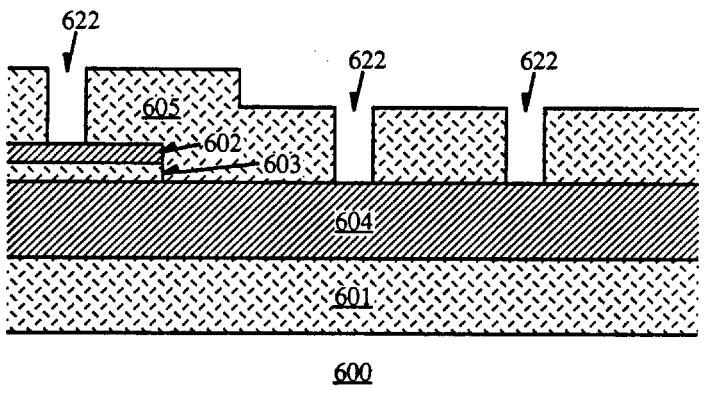
Figure 6F:
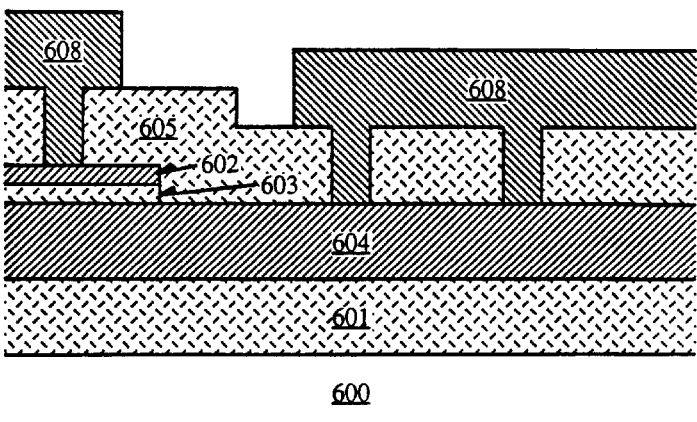

After the above-described process steps, the structure appears as shown in FIG. 6B. Next, patterning layer 610 is removed and insulative layer 605 is deposited as shown in FIG. 6C. In a currently preferred embodiment, insulative layer 605 comprises silicon dioxide. Next, as shown in FIG. 6D, patterning layer 620, having openings 621 formed therein, is formed on the surface of insulative layer 605. Next, an etch is performed, and patterning layer 620 is removed, resulting in the structure shown in FIG. 6E. Finally, upper level metallization layer 608 is deposited in vias 622 and on the surface of insulative layer 605, and the metallization layer is then appropriately patterned to provide interconnection to the underlying power distribution level 604, and to provide for coupling of capacitor plate 602 to power or ground as needed.

Figure 7:
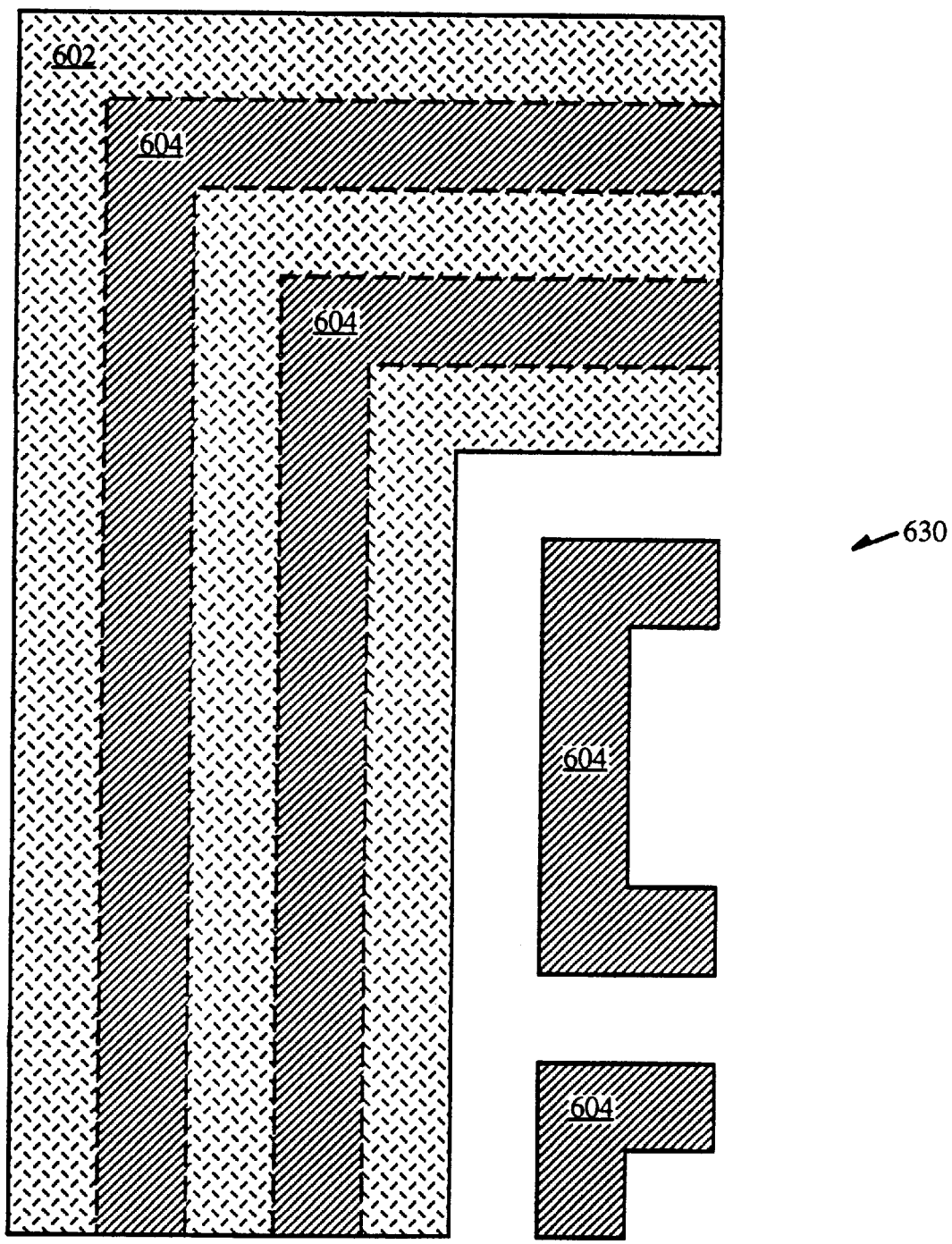
FIG. 7 shows a top view of a portion of the structure fabricated in accordance with FIGS. 6A–6F.

FIG. 7 shows a top view of the structure fabricated in accordance with FIG. 6. As shown, capacitor plate 602 exists above power distribution level 604 in some regions, but not in others, such as region 630. Thus, the decoupling capacitor plate 602 can be fabricated and placed where needed, and not placed in other regions 630 where the capacitance may cause problems. It is to be appreciated that not all of the lines 604 need be power distribution lines. For example, some of lines 604 may be power lines while others are ground lines or interconnection lines. The power line 604 underlying capacitor plate 602 is connected to one of power or ground, while the capacitor plate 602 is connected to the other of power or ground.

Figure 8A:
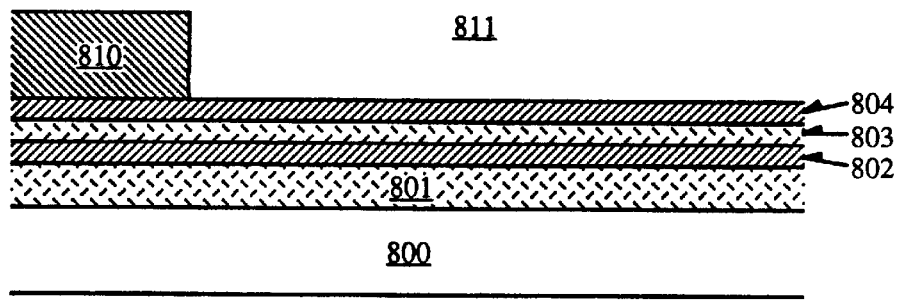
FIGS. 8A–8F illustrate the fabrication of an on-substrate capacitor on a portion of a substrate.
Figure 8B:
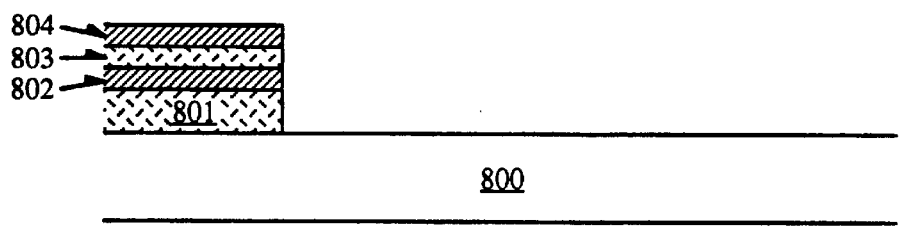
Figure 8C:
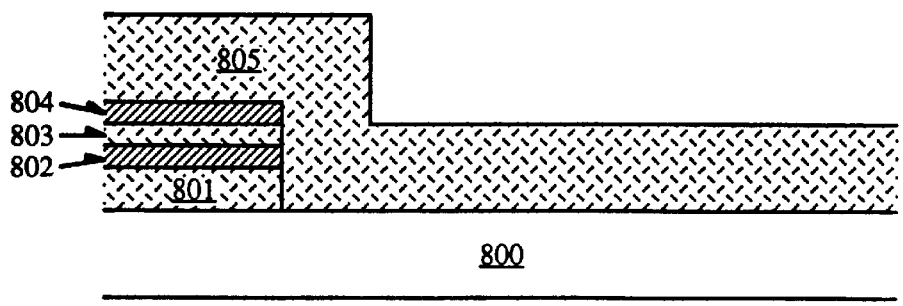
Figure 8D:
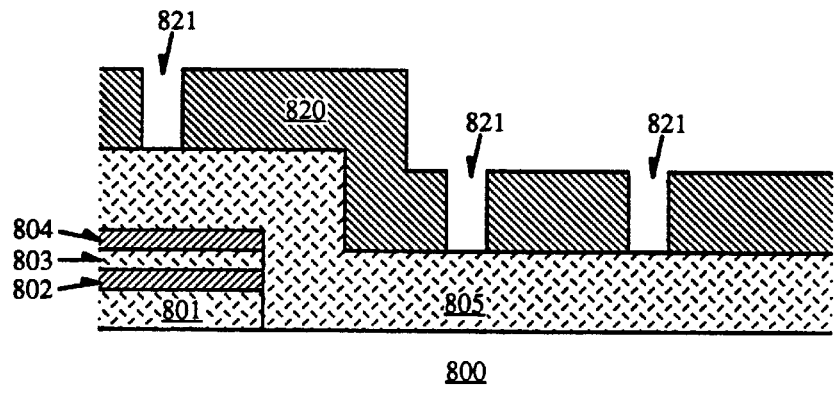
Figure 8E:
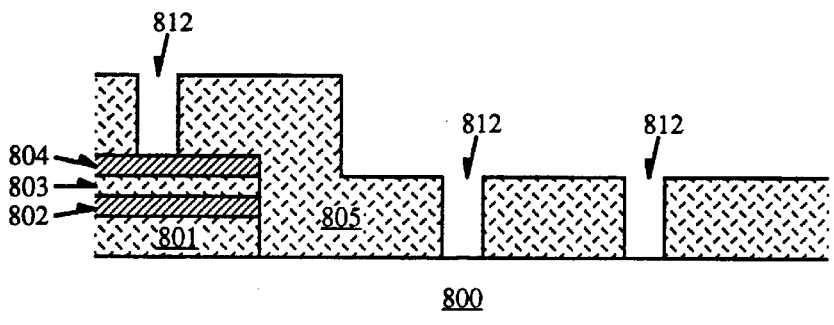
Figure 8F:
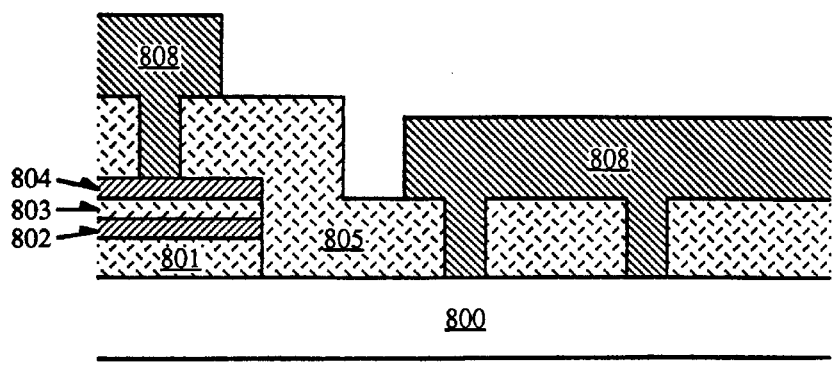

In addition to the selective area capacitor of the embodiment described in FIGS. 6 and 7, wherein one plate of the capacitor is formed of a layer consisting primarily of power or ground, a selective area capacitor similar to the embodiment shown in FIG. 1 is formed in accordance with an alternate embodiment. FIG. 8A shows substrate 800 having insulative layer 801, lower capacitor plate 802, insulative layer 803 and upper capacitor plate 804. In general, substrate 800 and layers 801–804 are similar in material and thickness to substrate 100 and layers 101–104, respectively. Patterning layer 810, having opening 811 formed therein, is formed on upper capacitor plate 804. The structure of FIG. 8A is subjected to a series of etches similar to those described previously, to remove layers 801–804 from region 811. The resulting structure, after removal of patterning layer 810, is shown in FIG. 8B. Then, as shown in FIG. 8C, insulative layer 805 is deposited over the structure of FIG. 8B. Next, as shown in FIG. 8D, patterning layer 820, having openings 821 formed therein, is formed on layer 805 followed by an etch to form vias 812 as shown in FIG. 8E. Next, metallization level 808 is deposited and patterned as shown in FIG. 8F to provide for a connection to upper capacitor plate 804 and interconnection between upper and lower metallization levels.

In other embodiments of the present invention, the ground planes described in the above-mentioned parent applications may similarly be placed in selective areas of the substrate. If desired, one or more selective area capacitors and one or more selective area ground planes can be placed on the substrate utilizing a conductive layer in common. For example, conductive layer 602 of FIG. 6 can be fabricated over power lines in one area of the substrate to form a capacitor, and over high frequency interconnections, which are interconnect lines that carry high frequency voltages, in another area to form a ground plane for those high frequency lines. Of course, there may be some performance trade-off to this approach, as the selective area capacitor generally requires a high dielectric constant insulative layer 603, while the selective area ground plane may require a somewhat lower dielectric constant insulative layer.

Figure 1E:
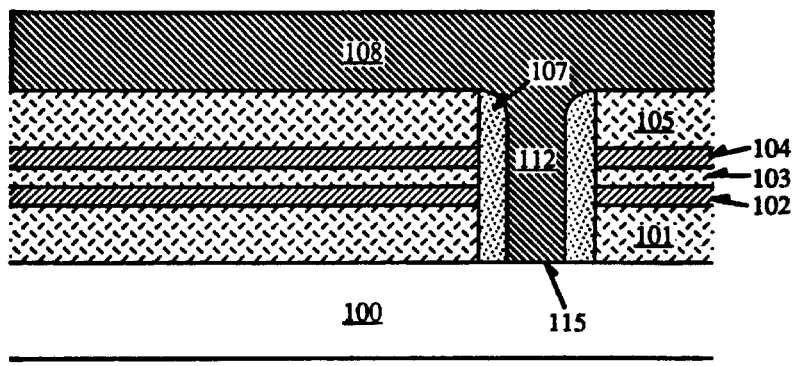
Figure 9A:
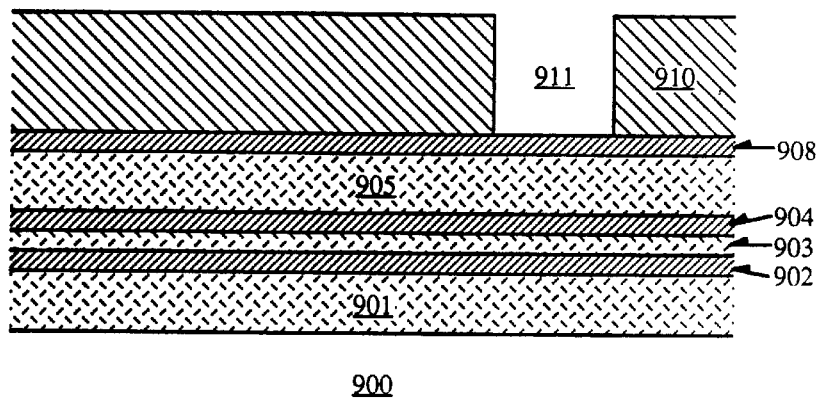
FIGS. 9A–9C illustrate the fabrication of an on-substrate capacitor utilizing an etch-stop/masking layer.
Figure 9B:
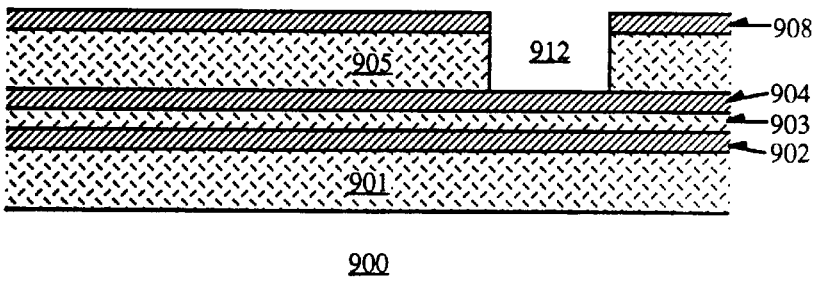
Figure 9C:
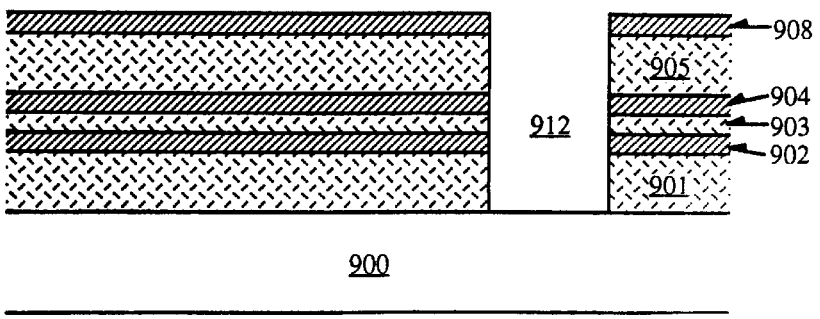

In fabricating the capacitor of the present invention, an etch-stop/masking layer may be used as an additional masking layer prior to etching through several layers. For example, an alternate method of forming the structure shown in FIG. 1E is shown in FIGS. 9A–9C. FIG. 9A shows substrate 900 having layers 901–905 thereon. Substrate 900 and layers 901–905 are generally the same as substrate 100 and layers 101–105, respectively. Also shown in FIG. 9A is etch-stop/masking layer 908. Etch-stop/masking layer 908 is a thin layer of material, having a thickness in the range of approximately 0.01–1.0 μm, preferably comprising silicon nitride or silicon, which is resistant to the etch processes used to etch layer 901. Patterning layer 910, having opening 911 formed therein, is formed on the surface of etch-stop/masking layer 908. Next, an opening is formed in the region exposed by opening 911 through etch-stop/masking layer 908 and layer 905. Then, patterning layer 910 is removed resulting in the structure shown in FIG. 9B.

Following removal of patterning layer 910, layers 904, 903, 902, and 901 are etched sequentially to yield the structure shown in FIG. 9C. As described previously, each layer is etched sequentially in separate etching processes to form opening 912. Alternatively, a single etch may be used to etch through all of the layers. The etch-stop/masking layer 908 facilitates the multi-step processes used to form opening 912 by preventing the etching processes from unduly degrading the uppermost insulative layer 905. In particular, the etch-stop/masking layer 908 prevents degradation or undercutting of the photoresist layer 910, particularly during the etching of layers 902 and 904, resulting in the substantially vertical sidewall of opening 912 illustrated in FIG. 9C. Thus, a widening or presence of a stepped structure, with the uppermost layers being etched to a greater lateral extent, is prevented.

After formation of opening 912 as shown in FIG. 9C, etch-stop/masking layer 908 is removed. Following the steps shown in FIGS. 9A–9C, processing proceeds as described above in relation to FIGS. 1C–1E. In the foregoing, etch-stop/masking layer 908 is removed. However, for certain applications layer 908 may be retained. For example, if the layer is formed of an insulating material, it may be desired to retain it. For an alternate embodiment of the present invention in which a plug fill process, as described earlier, is utilized to fill opening 912, etch-stop/masking layer 908 is used as an etch-stop layer to assist in the etch-back of the conductive material filling opening 912.

Thus, a novel decoupling capacitor is disclosed. The capacitor of the present invention is placed directly on the substrate for which the capacitor serves as a decoupling capacitor. In the present invention, the capacitor may be placed on selective areas of the substrate by fabricating two plates over selective areas of the substrate, or by fabricating a plate over a preexisting power or ground plane. In the present invention, no extra masking steps are required to form the disclosed capacitor. An isolated via, fabricated with a single masking step, is also disclosed. Further, several methods of coupling the upper and lower plates to power and ground are disclosed. A maximum of only two additional masking steps are required, as opposed to prior art methodologies requiring four masking steps. An embodiment utilizing an etch-stop layer during fabrication has also been described.

It is to be understood that the specific methods of connection to power and ground, or specific process sequences described, are not necessarily limited to the embodiment in which they are shown. In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A process for forming a capacitor on a substrate having circuitry, the process comprising the steps of:

depositing a first insulative layer on said substrate;

depositing a first conductive layer on said first insulative layer;

depositing a second insulative layer on said first conductive layer;

depositing a second conductive layer on said second insulative layer;

forming a patterning layer on a first region of said substrate, leaving a second region of said substrate exposed;

removing said second conductive layer, said second insulative layer, said first conductive layer and said first insulative layer from said second region;

depositing a third insulative layer on said first and said second regions;

forming openings in said third insulative layer in said first and said second regions;

depositing a third conductive layer in said openings; and depositing an upper level conductive layer on said third insulative layer and said third conductive layer.

2. The process as described in claim 1 wherein said steps of depositing said third conductive layer and depositing said upper level conductive layer are performed simultaneously.

3. The process as described in claim 1 further comprising the steps of:

depositing an etch-stop layer on said third insulative layer prior to forming said patterning layer; and etching said etch-stop layer from said first region subsequent to forming said patterning layer.

4. The process as described in claim 3 wherein said etch-stop layer comprises a material selected from the group consisting of silicon and silicon nitride.

5. A process for forming a capacitor on a substrate having circuitry comprising the steps of:

depositing a first insulative layer on said substrate;

depositing a first conductive layer on said first insulative layer;

depositing a second insulative layer on said first conductive layer;

depositing a second conductive layer on said second insulative layer;

forming a patterning layer on a first region of said substrate, leaving exposed a second region of said substrate;

removing said second conductive layer from said second region;

depositing a third insulative layer on said first and said second regions;

forming openings in said third insulative layer in said first and said second regions;

depositing a third conductive layer in said openings; and depositing an upper level conductive layer on said third insulative layer and said third conductive layer.

6. The process as described in claim 5 further comprising the steps of:

depositing an etch-stop layer on said third insulative layer prior to forming said patterning layer; and etching said etch-stop layer from said first region subsequent to forming said patterning layer.

7. The process as described in claim 6 wherein said etch-stop layer comprises a material selected from the group consisting of silicon and silicon nitride.

8. The process as described in claim 5 wherein said first conductive layer is disposed in a portion of said second region and comprises a ground plane.

9. The process as described in claim 8 wherein said ground plane is disposed in a portion of said second region having an interconnect line to carry a signal.

10. The process as described in claim 5 wherein said first conductive layer comprises a power distribution level.

11. The process as described in claim 5 wherein said first conductive layer is patterned prior to said step of depositing a second insulative layer, such that said first conductive layer is removed from a portion of said first region, said second conductive layer comprising a ground plane in said portion of said first region.

12. The process as described in claim 8 wherein said portion of said first region having said ground plane comprises an interconnect line to carry a signal.

* * * * *